(12) United States Patent
Yun

(10) Patent No.: US 8,258,593 B2
(45) Date of Patent: Sep. 4, 2012

(54) IMAGE SENSOR HAVING DIELECTRIC LAYER WHICH ALLOWS FIRST IMPURITY REGION OF PHOTODIODE TO BE ISOLATED FROM CONTACT PLUG AND SECOND IMPURITY REGION OF THE PHOTODIODE TO CONTACT THE CONTACT PLUG

(75) Inventor: Ki-Jun Yun, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 276 days.

(21) Appl. No.: 12/615,075

(22) Filed: Nov. 9, 2009

(65) Prior Publication Data

US 2010/0117180 A1 May 13, 2010

(30) Foreign Application Priority Data

Nov. 11, 2008 (KR) .................. 10-2008-0111417

(51) Int. Cl.
*H01L 31/0232* (2006.01)
(52) U.S. Cl. ............... 257/432; 257/461; 257/E31.127; 438/24
(58) Field of Classification Search ............ 257/292, 257/458
See application file for complete search history.

(56) References Cited

U.S. PATENT DOCUMENTS

2010/0025800 A1* 2/2010 Kim .......................... 257/459
\* cited by examiner

*Primary Examiner* — Marcos D. Pizarro
*Assistant Examiner* — Eva Yan Montalvo
(74) *Attorney, Agent, or Firm* — Sherr & Jiang, PLLC

(57) ABSTRACT

An image sensor and a method of manufacturing the same. An image sensor may include a first interlayer dielectric layer having a first metal wiring and/or a bonding silicon including impurity regions on and/or over a first interlayer dielectric layer. An image sensor may include a second interlayer dielectric layer formed on and/or over a bonding silicon, and/or a first contact plug connected to a first metal wiring. An image sensor may include a third interlayer dielectric layer on and/or over a second interlayer dielectric layer, a second contact plug connected to a first impurity region and/or a second metal wiring on and/or over a second interlayer dielectric layer. An image sensor may include and a color filter layer and/or a microlens. A dielectric layer may be between a first contact plug and a first impurity region. A dielectric layer may be on and/or over a second interlayer dielectric layer.

10 Claims, 6 Drawing Sheets

Figure 1:
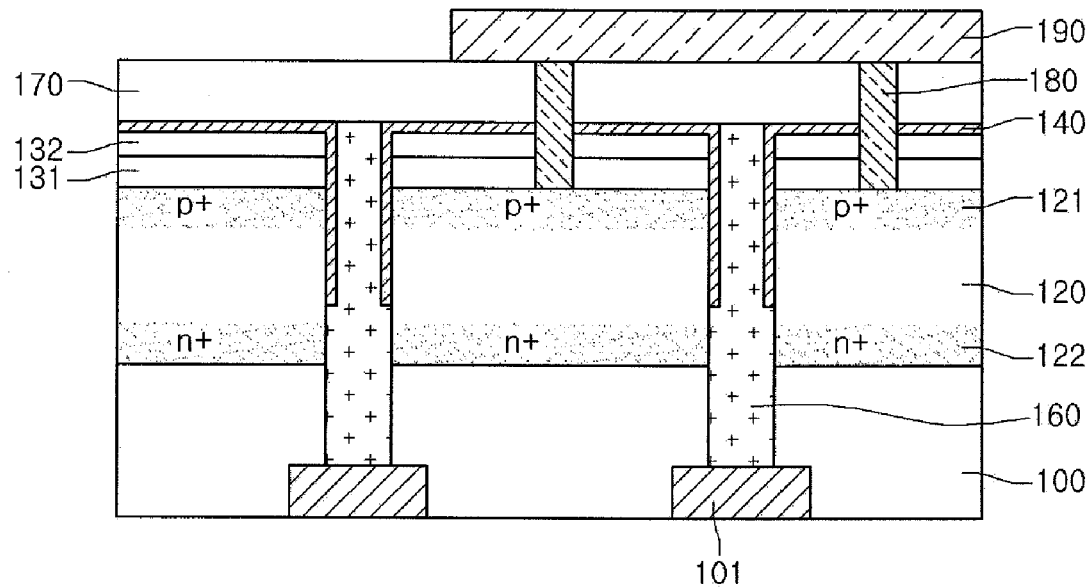

IMAGE SENSOR HAVING DIELECTRIC LAYER WHICH ALLOWS FIRST IMPURITY REGION OF PHOTODIODE TO BE ISOLATED FROM CONTACT PLUG AND SECOND IMPURITY REGION OF THE PHOTODIODE TO CONTACT THE CONTACT PLUG

The present application claims priority under 35 U.S.C. 119 to Korean Patent Application No. 10-2008-0111417 (filed on Nov. 11, 2008) which is hereby incorporated by reference in its entirety.

BACKGROUND

Embodiments relate to an image sensor and a method of manufacturing an image sensor. An image sensor may include a semiconductor device which may convert an optical image into an electrical signal. An image sensor may be categorized as a charge coupled device (CCD) image sensor and/or a complementary metal oxide silicon (CMOS) image sensor. A CMOS image sensor may form a photodiode and/or a MOS transistor within a unit pixel to sequentially detect electrical signals of each unit pixel in a switching scheme, implementing an image. A CMOS image sensor manufacturing process may be accompanied by a chemical mechanical polishing (CMP) process, which may form a multilayer including a plurality of metal lines and/or dielectric layers after forming a photodiode. However, degradation in light sensitivity may be caused due to increase in intervals from a photodiode to a color filter, for example. Also, bad pixels may be maximized due to maximized defects.

Accordingly, there is a need for an image sensor and a method of manufacturing an image sensor that may minimize an isolation etch process of a silicon bonding wafer, which may include an upper photodiode, and/or which may minimize plasma damage.

SUMMARY

Embodiments relate to an image sensor and methods of manufacturing the same. According to embodiments, an image sensor may form a photodiode using two chips. In embodiments, an image chip may form a color filter array and/or a microlens. In embodiments, a logic chip may be configured of a driver IC, driving an image chip and/or a logic array which may be capable of providing functions enabling three-dimensional integration of an image chip and a logic chip using one pad. Embodiments relate to a method of manufacturing the same.

According to embodiments, an image sensor may minimize a distance between a photodiode and a microlens, for example by omitting a plurality of metal lines on and/or over an upper portion of a photodiode. In embodiments, a light path may be substantially minimized. In embodiments, light sensitivity may be maximized. Embodiments relate to a method of manufacturing the same.

According to embodiments, a method of manufacturing may include maximizing isolation and/or contact between photodiode regions which may constitute a unit pixel. In embodiments, a method of manufacturing may include implementing isolation between a p+ region of a photodiode and a contact plug. In embodiments, a method of manufacturing may include implementing a contact between a n+ region of a photodiode and a contact plug.

Embodiments relate to an image sensor. According to embodiments, an image sensor may include a first interlayer dielectric layer including a first metal wiring. In embodiments, an image sensor may include a bonding silicon formed on and/or over a first interlayer dielectric layer, which may include a first impurity region and/or a second impurity region. In embodiments, an image sensor may include a second interlayer dielectric layer formed on and/or over a bonding silicon. In embodiments, an image sensor may include a first contact plug connected to a first metal wiring, for example by penetrating through a bonding silicon.

According to embodiments, an image sensor may include a third interlayer dielectric layer formed on and/or over a second interlayer dielectric layer. In embodiments, an image sensor may include a second contact plug connected to a first impurity region, for example by penetrating through a third interlayer dielectric layer. In embodiments, an image sensor may include a second metal wiring formed on and/or over a second interlayer dielectric layer and may be connected to a second contact plug. In embodiments, an image sensor may include a color filter layer and/or a microlens formed on and/or over an upper side of a second metal wiring.

According to embodiments, an image sensor may include a dielectric layer, which may be formed for isolation, between a first contact plug and a first impurity region. In embodiments, a portion of a dielectric layer may be formed on and/or over a second interlayer dielectric layer. In embodiments, a dielectric layer may be extended from an upper surface of a second interlayer dielectric layer to between a first contact plug and a first impurity region.

Embodiments relate to a method of manufacturing an image sensor. According to embodiments, a method of manufacturing an image sensor may include forming a bonding silicon by bonding silicon with a first interlayer dielectric layer which may include a first metal wiring. In embodiments, a method of manufacturing an image sensor may include forming a first impurity region and/or a second impurity region inside a bonding silicon. In embodiments, a method of manufacturing an image sensor may include forming a second interlayer dielectric layer on and/or over a bonding silicon.

According to embodiments, a method of manufacturing an image sensor may include coating and patterning a first photoresist on and/or over a second interlayer dielectric layer. In embodiments, a method of manufacturing an image sensor may include forming a first contact hole by etching a bonding silicon and/or a first interlayer dielectric layer using a first photoresist resist as an etching mask. In embodiments, a method of manufacturing an image sensor may include removing a first photoresist and/or forming a second photoresist inside a first contact hole. In embodiments, a method of manufacturing an image sensor may include selectively removing a second photoresist, for example leaving a portion of a second photoresist inside a first contact hole.

According to embodiments, a method of manufacturing an image sensor may include depositing and/or forming a dielectric layer inside a first contact hole. In embodiments, a method of manufacturing an image sensor may include removing a dielectric layer which may be formed on and/or over a second photoresist, for example sequential removal. In embodiments, a method of manufacturing an image sensor may include forming a first contact plug connected to a first metal wiring inside a first contact hole. In embodiments, a method of manufacturing an image sensor may include forming a second contact plug which may penetrate through a second interlayer dielectric layer.

DRAWINGS

Example FIG. 1 is a diagram illustrating an image sensor in accordance with embodiments.

Figure 2:
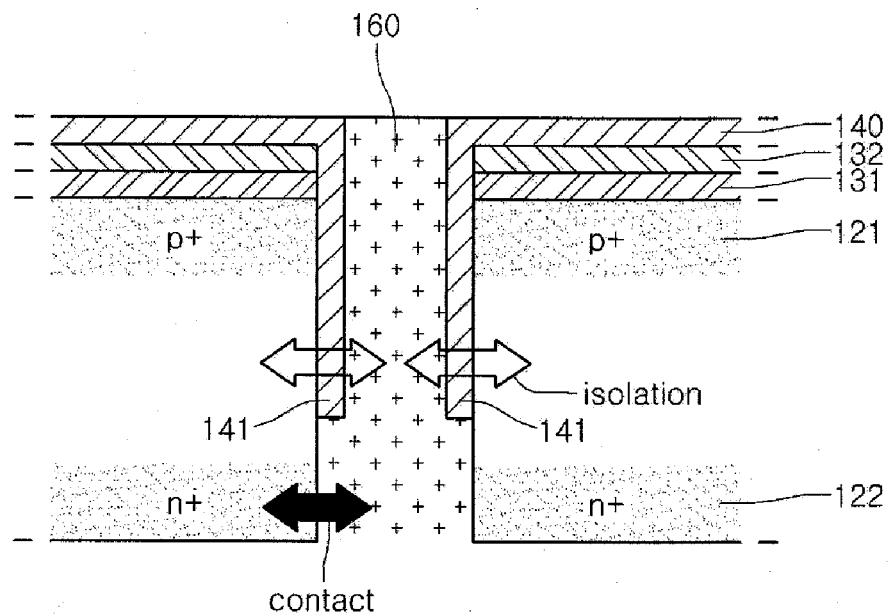

Example FIG. 2 is a diagram illustrating an isolation and a contact between a photodiode region and a contact plug in accordance with embodiments.

Example FIG. 3 to FIG. 12 are diagrams illustrating a method of manufacturing an images sensor in accordance with embodiments.

DESCRIPTION

Embodiments relate to an image sensor. Referring to example FIG. 1, a diagram illustrates an image sensor in accordance with embodiments. Referring to example FIG. 2, a diagram illustrates an isolation and a contact between a photodiode region and a contact plug in accordance with embodiments. In embodiments, for reference, a portion of a pixel region where a photodiode may be formed is illustrated, for example where a logic region where a lower wiring and/or an upper wiring may be formed on one side of a pixel region.

Referring to FIG. 1, an image sensor may include first interlayer dielectric layer 100 having first metal wiring 101. According to embodiments, first interlayer dielectric layer 100 may be bonded where an operating unit, such as a transistor, may be formed. In embodiments, cleavage on c-Si may be performed. In embodiments, boding silicon 120 may be formed on and/or over first interlayer dielectric layer 100. In embodiments, first interlayer dielectric layer 100 may include an oxide such as tetraethoxysilane (TEOS). In embodiments, a plurality of metal wiring lines, interlayer dielectric films and/or a semiconductor substrate may be included in a lower side of first interlayer dielectric layer 100.

According to embodiments, a photodiode may be formed including a plurality of regions and may be formed within bonding silicon 120. In embodiments, a photodiode may include first impurity region 121 formed on and/or over an upper side of bonding silicon 120 and/or second impurity region 122 formed on and/or over a lower side of bonding silicon 120. In embodiments, a photodiode may include a region into which n+ conductive type impurity may be injected on and/or over a lower side of bonding silicon 120 and/or a region into which p-conductive type impurity may be injected on and/or over an upper side of bonding silicon 120. In embodiments, a photodiode within bonding silicon 120 may use any variation of electrons and/or holes as electrical signals. In embodiments, a p+ region on and/or over an upper side of a silicon and a n+ region on and/or over a lower side of a silicon may use electrons as signals when light is received, thereby allowing electrons gathering to an n+ region to move through a contact plug and a metal line. In embodiments, when holes are used as signals, an impurity may be formed substantially differently.

According to embodiments, first contact plug 160 may be formed in bonding silicon 120. In embodiments, first contact plug 160 may be formed in a region between photodiodes of each pixel region and a dielectric layer 140. In embodiments, dielectric layer 140 may isolates first impurity region 121 of a photodiode and may be formed at a side surface of first contact plug 160. In embodiments, dielectric layer 140 may not be formed on a region adjacent second impurity region 122 of a photodiode.

According to embodiments, dielectric layer 140 may include a low temperature oxide (LTO) film. In embodiments, dielectric layer 140 may allow first impurity region 121 of a photodiode to be isolated from a contact plug, and second impurity region 122 may be contacted by first contact plug 160. In embodiments, dielectric layer 140 may extended from an upper surface of a second interlayer dielectric layer, for example including layers 131 and/or 132, to first impurity region 121.

According to embodiments, an upper side of bonding silicon 120, which may be provided with a photodiode where a plurality of impurity regions may be formed, may include an oxide layer 131 and/or a nitride layer 132 thereover. In embodiments, oxide layer 131 and/or a nitride layer 132 may isolate an interlayer and may be stacked, for example in sequence. In embodiments, second contact plug 180 may contact first impurity region 121 of a photodiode, for example penetrating through oxide layer 131 and/or nitride layer 132. In embodiments, third interlayer dielectric layer 170 may isolate an interlayer and/or may be formed on and/or over nitride layer 132. In embodiments, if oxide layer 131 or nitride layer 132 formed on and/or over bonding silicon 120 relates to a second interlayer dielectric film, interlayer dielectric layer 170 formed on and/or over nitride layer 132 may relate to a third interlayer dielectric film.

According to embodiments, second metal wiring 190 may be electrically connected to second contact plug 180, and may be formed on and/or over third interlayer dielectric layer 170. In embodiments, a passivation layer may be formed on and/or over an upper side of second metal wiring 190. In embodiments, a color filter may be formed on and/or over an upper portion of a passivation layer. In embodiments, a microlens may receive light and may be formed on and/or over an upper side of a color filter.

According to embodiments, an isolation and contact between respective photodiodes which may constitute a unit pixel may be formed. Referring to FIG. 2, respective photodiodes which may constitute a unit pixel may be formed on both sides of first contact plug 160, which may be centered therebetween. In embodiments, a photodiode may include first impurity region 121 and/or second impurity region 122 to generate holes and/or electrons as signals at a time of receiving light. In embodiments, when using electrons as signals, first impurity region 121 into which p+ type impurity may be injected may be formed inside boding silicon 120. In embodiments, second impurity region 122 into which n+ type impurity may be injected may be formed under a position where first impurity region 121 may be formed. In embodiments, when receiving light, electrons generated from a photodiode may be moved to first metal wiring 101 through second impurity region 122 and/or first contact plug 160. In embodiments, an electrical signals according to light received may be transferred.

According to embodiments, first impurity regions 121 of respective photodiodes that may constitute a unit pixel may be isolated from contact plug 160 which may become a moving path of the electrons. In embodiments, an isolation layer may be formed on and/or over a periphery of first contact plug 160, such as dielectric layer 140 which may be formed on and/or over a region adjacent to first impurity region 121 but not a region adjacent to second impurity region 122. In embodiments, a portion of dielectric layer 140 may be formed on and/or over nitride film 132, which may serve to isolate an interlayer together with third interlayer dielectric layer 170. In embodiments, a second impurity region may be contacted to a contact plug by the formation of a dielectric layer, and/or a first impurity region may be isolated from a contact plug.

Figure 3:
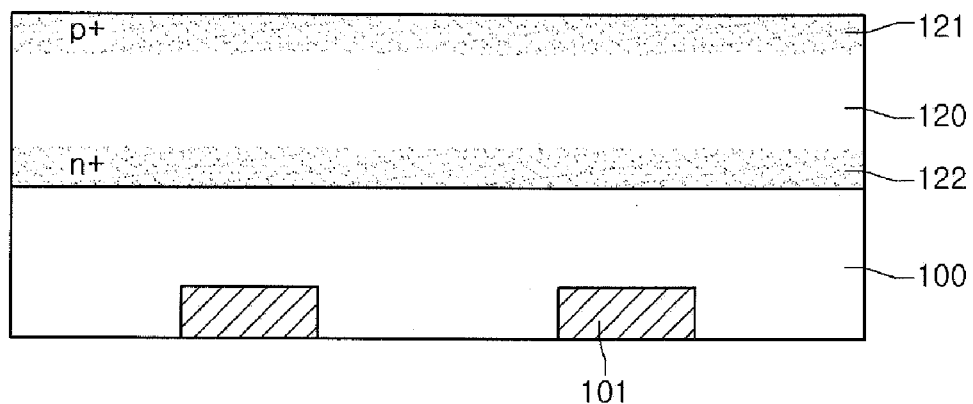

Embodiments relate to a method of manufacturing an image sensor. Referring to example FIG. 3 to FIG. 12, a method of manufacturing an image sensor in accordance with embodiments is illustrated. Referring to FIG. 3, first interlayer dielectric layer 100 may be formed where an operating unit may be constituted. In embodiments, cleavage on c-Si may be performed. In embodiments, bonding silicon 120 may be formed on and/or over first interlayer dielectric layer 100. In embodiments, first interlayer dielectric layer 100 may include first metal wiring 101.

According to embodiments, photodiodes may be formed inside bonding silicon 120. In embodiments, first impurity region 121 may be formed into which a first conductive type impurity may be injected. In embodiments, a second impurity region 122 may be formed into which a second conductive type impurity may be injected. In embodiments, regions 121 and/or 122 may be formed inside bonding silicon 120. In embodiments, first impurity region 121 may be formed on and/or over an upper side of the inside of bonding silicon 120, and/or second impurity region 122 may be formed under first impurity region 121. In embodiments, a n-impurity region and/or a depletion layer may be formed between first impurity region 121 and second impurity region 122.

Figure 4:
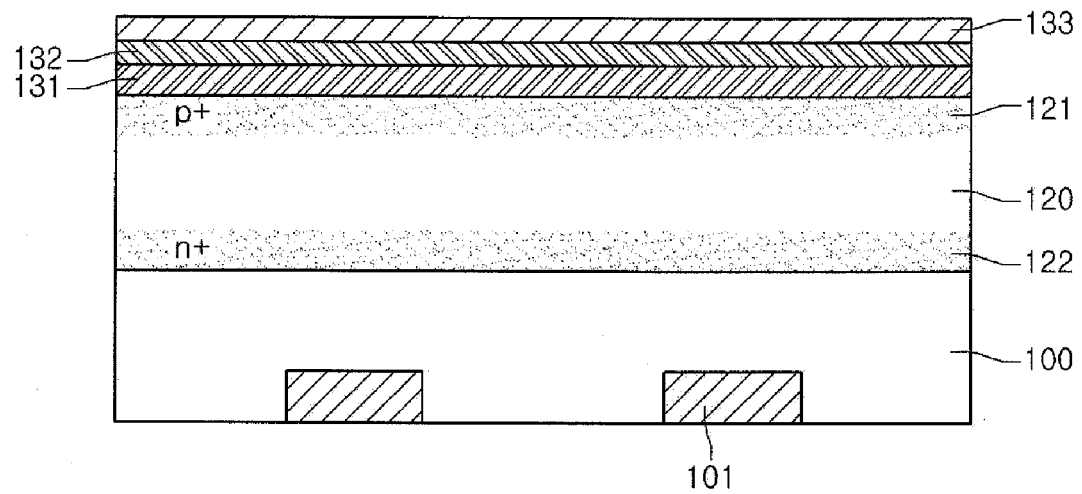

Referring to FIG. 4, an ONO layer 131, 132, and 133 may be deposited, for example as a second interlayer dielectric layer, on and/or over bonding silicon 120 having photodiodes. According to embodiments, an ONO layer may include first oxide layer 131, nitride layer 132, and/or second oxide layer 133. In embodiments, any one of oxide layers 131, 133 and nitride layer 132 may be formed. In embodiments, oxide layers 131 and/or 133 may include $SiH_4$ at a thickness of approximately 1000 Å. In embodiments, nitride layer 132 may be formed at a thickness of approximately 1000 Å. In embodiments, ONO layer 131, 132, and/or 133 may operate as a hard mask in an etch process.

Figure 5:
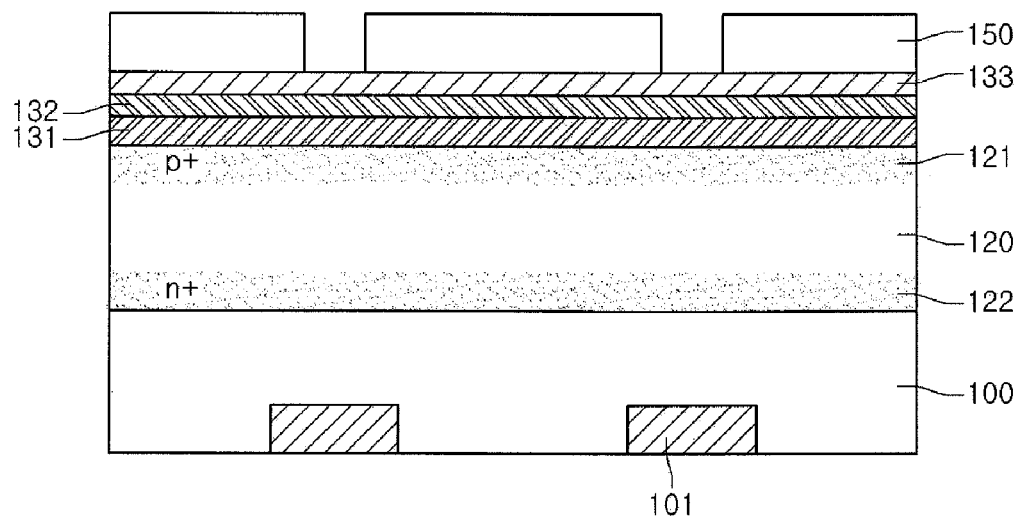

Referring to FIG. 5, first photoresist 150 may be coated on and/or over second oxide layer 133. According to embodiments, first photoresist 150 may be patterned to prepare an etch process to expose a portion of first metal wiring 101. In embodiments, patterned first photoresist 150 may include an open portion which may correspond to a region where a first contact plug may be formed.

Figure 6:
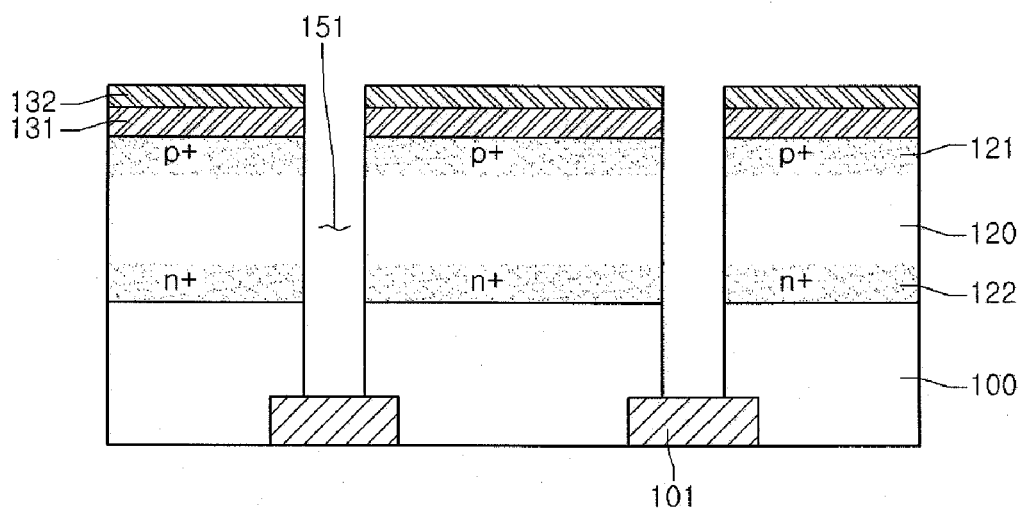

Referring to FIG. 6, an etch process may be performed using patterned photoresist 150 and/or ONO layer 131, 132, and/or 133 as an etching mask. According to embodiments, an etch process may etching ONO layer 131, 132, and/or 133, bonding silicon 120, and/or first interlayer dielectric layer 100. In embodiments, in an etching process, a portion of first metal wiring 101 formed on and/or over first interlayer dielectric layer 100 may be exposed and a first contact hole 151 may be formed in bonding silicon 120 and/or first interlayer dielectric layer 100. In embodiments, in an etch process using first photoresist 150 and/or an ONO layer as an etching mask, second oxide layer 133 may remain due to a difference in etching selectivity between silicon and oxide at the time of etching a bonding silicon. In embodiments, third oxide layer 133 may have substantially the same selectivity and may be etched during etching first interlayer dielectric layer 100. In embodiments, if an etch process to expose a portion of first metal wiring 101 is substantially completed, first oxide layer 131 and/or nitride layer 132 may exist on and/or over bonding silicon 120.

Figure 7:
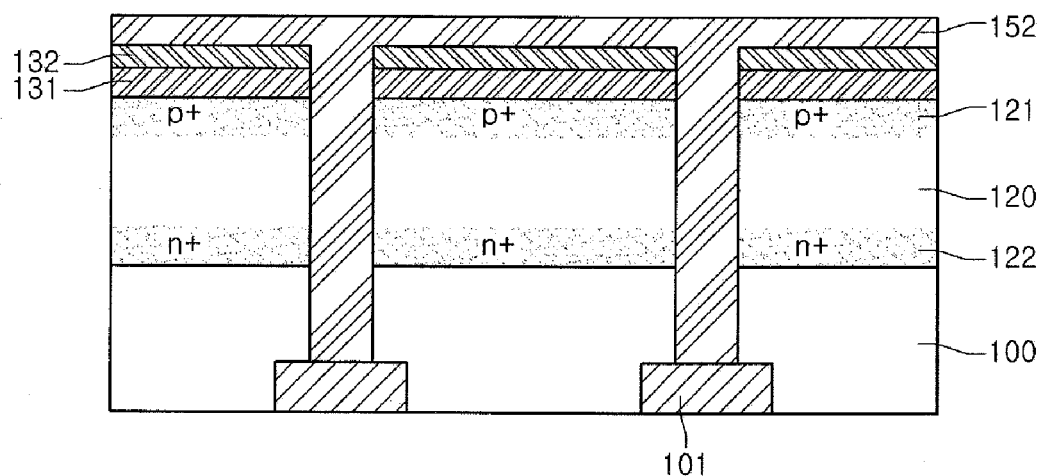

Referring to FIG. 7, a photoresist which may be used to form a first contact hole may be substantially removed. In embodiments, Novorac material may be coated inside first contact hole 151 and/or on and/or over second interlayer dielectric layer 132. In embodiments, Novorac material may include a kind of photoresist, including material whose viscosity is less than a photoresist used in patterning. In embodiments, second photoresist 152 may be coated inside first contact hole 151 and/or on and/or over second interlayer dielectric layer 132. In embodiments, second photoresist 152 filled inside first contact hole 151 may be removed through an ashing process and/or a recess process, for example.

Figure 8:
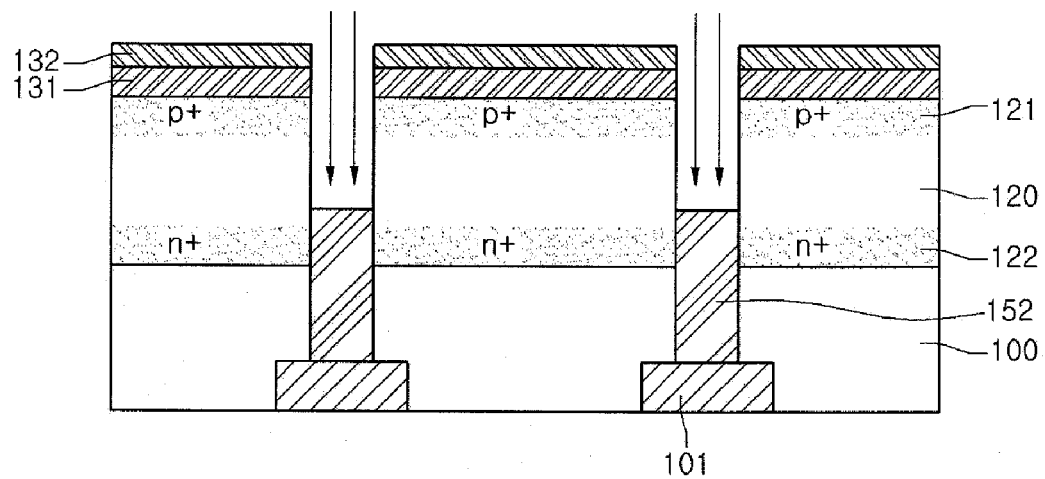

Referring to FIG. 8, an ashing process and/or a recess process may be performed on second photoresist 152. According to embodiments, a removing process to remove second photoresist 152 may allow second photoresist 152 formed in second impurity region 122 of bonding silicon 120 to remain at substantially the same height, or higher, relative to second impurity region 122. In embodiments, a removing process of second photoresist 152 may proceed to a position where first impurity region 121 of bonding silicon 120 may be formed. In embodiments, a partial surface of first impurity region 121 of a photodiode may be exposed and second impurity region 122 may not be exposed by remaining second photoresist 152.

Figure 9:
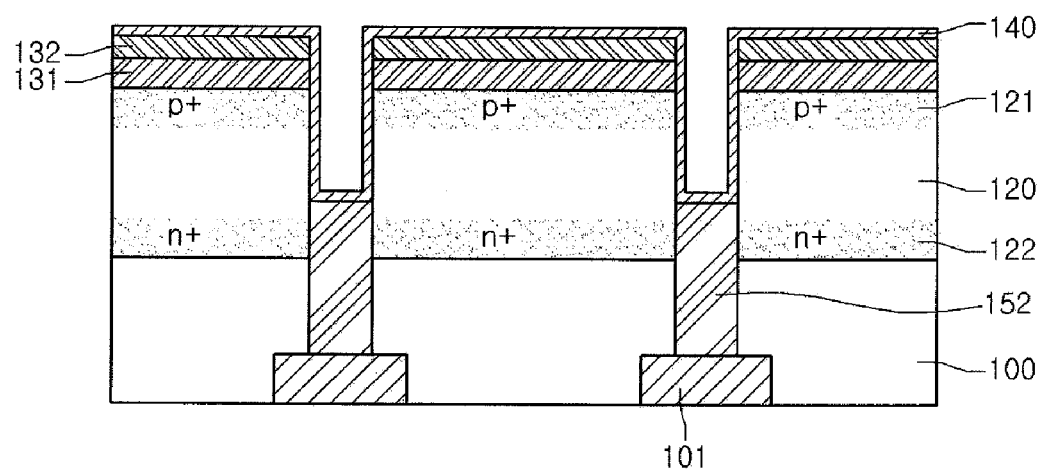

Referring to FIG. 9, a process of depositing oxide on and/or over second photoresist 152 remaining in first contact hole and/or second interlayer dielectric layer 132 may be performed. According to embodiments, oxide deposited on and/or over second photoresist 152 and/or second interlayer dielectric layer 132 may include LTO film 140, which may be deposited at a relatively low temperature. A temperature used in depositing an oxide may exceed 400° C. In embodiments, a LTO layer may be deposited at a relatively low temperature, for example at approximately 180° C., and may be formed to maintain a shape of a photoresist remaining inside a first contact hole.

Figure 10:
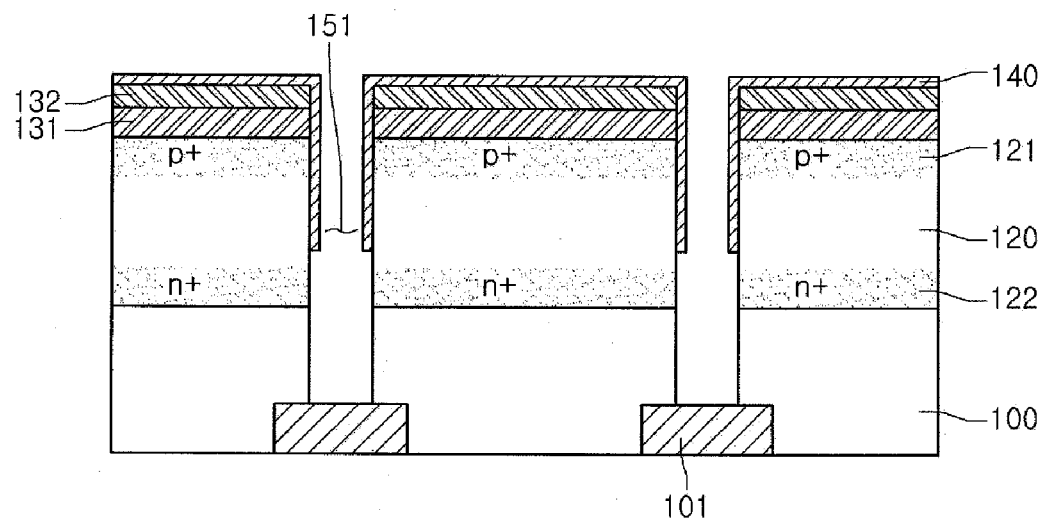

Referring to FIG. 10, an etch process to remove LTO layer 140 formed on and/or over second photoresist 152 may be performed. According to embodiments, an ashing process and/or a recess process may remove second photoresist 152 remaining inside first contact hole 151. In embodiments, an etch process may remove LTO layer 140 formed on and/or over an upper portion of second photoresist 152, while LTO layer 140 formed at a side wall of an inside of first contact hole 151 may remain. In embodiments, a photoresist pattern that may be used as an etching mask may be formed on and/or over a LTO layer formed at a side wall of an inside of first contact hole 151 and a LTO layer formed on and/or over an upper portion of second photoresist 152 inside first contact hole 151 may be selectively etched. In embodiments, an ashing process and/or a recess process may remove second photoresist 152 formed inside first contact hole 151 after removing a portion of an LTO layer. In embodiments, LTO layer 140 may remain at portions of a side wall of first contact hole 151. In embodiments, a first impurity region of a photodiode may be covered by LTO layer 140 and/or may not be exposed. In embodiments, a portion of second impurity region 122 of a photodiode may be exposed due to a removal of second photoresist 152.

Figure 11:
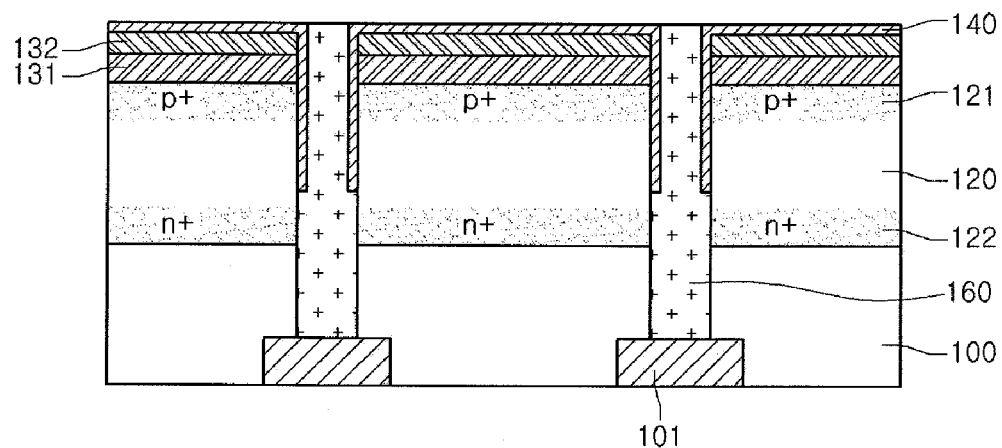
Figure 12:
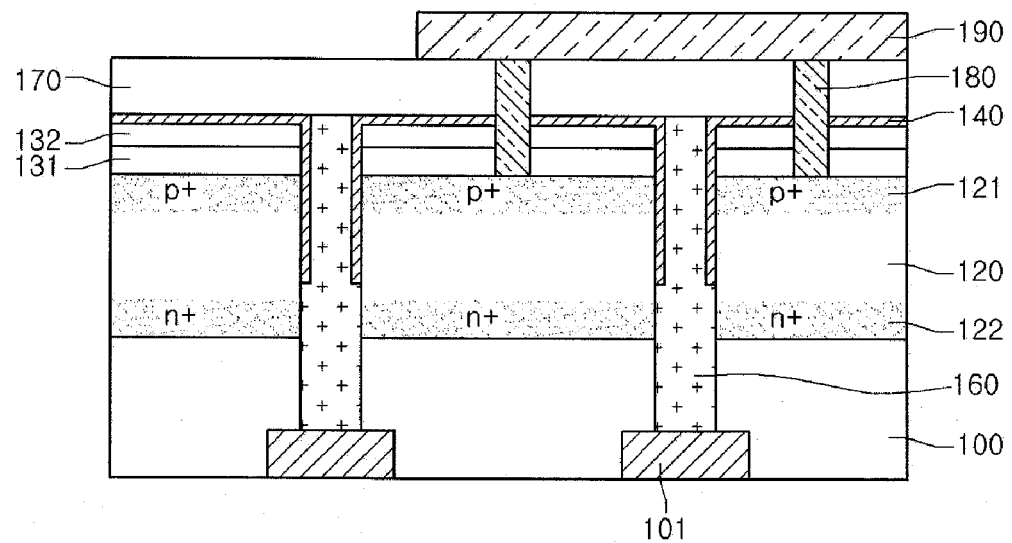

Referring to FIG. 11, first contact plug 160 may be formed inside contact hole 151 formed in bonding silicon 120 and/or first interlayer dielectric layer 100. According to embodiments, formation of first contact plug 160 may include a planarization process after gap-filling with a metal material such as tungsten, for example. Referring to FIG. 12, a dielectric layer may be deposited on and/or over second interlayer dielectric layers 131 and/or 132, and/or first contact plug 160 to form third interlayer dielectric layer 170. According to embodiments, a third photoresist may be coated and patterned on and/or over third interlayer dielectric layer 170. In embodiments, third interlayer dielectric layer 170 and/or second interlayer dielectric layer, which may include layers 131 and/or 132, may be etched to form a contact hole to form second contact plug 180. In embodiments, second contact plug 180 may be formed inside a contact hole.

According to embodiments, second contact plug 180 may be formed to be connectable to first impurity region 121 of a photodiode region in boding silicon 120. In embodiments, reverse bias may be applied to a photodiode. In embodiments, second metal wiring 190 to may be formed on and/or over third interlayer dielectric layer 170 and/or may be electrically connected to second contact plug 180. In embodiments, a process to form a passivation layer may be performed on and/or over second metal wiring 190. In embodiments, a process to forming a color filter layer on and/or over a passivation layer and/or a process to form a microlens by coating photoresist on and/or over a color filter layer may be performed.

According to embodiments, use of a dry etching such as a plasma etching may be minimized in forming a photodiode, contact plug, etc. In embodiments, it may be possible to minimize damage caused to a silicon device. In embodiments, in photodiode regions that may constitute a unit pixel, a maximized isolation may be made between first impurity regions and a contact, and/or a contact plug may be relatively finely made for second impurity regions.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    a first interlayer dielectric layer including a first metal wiring;
    a bonding silicon over said first interlayer dielectric layer including a first impurity region and a second impurity region;
    a second interlayer dielectric layer over said bonding silicon;
    a first contact plug connected to said first metal wiring by penetrating through at least a portion of said bonding silicon; and
    a dielectric layer between said first contact plug and said first impurity region, wherein at least a portion of said dielectric layer is formed over said second interlayer dielectric layer.

2. The apparatus of claim 1, comprising:
    a third interlayer dielectric layer over said second interlayer dielectric layer;
    a second contact plug connected to said first impurity region by penetrating through at least a portion of said third interlayer dielectric layer; and
    a second metal wiring over said second interlayer dielectric layer and connected to said second contact plug.

3. The apparatus of claim 2, comprising at least one of a color filter layer and a microlens over an upper side of said second metal wiring.

4. The apparatus of claim 1, wherein said dielectric layer comprises a low temperature oxide layer.

5. The apparatus of claim 4, wherein said low temperature oxide layer is configured to be deposited at approximately 180° C.

6. The apparatus of claim 1, wherein said dielectric layer extends from an upper surface of said second interlayer dielectric layer to between said first contact plug and said first impurity region.

7. The apparatus of claim 1, wherein said second interlayer dielectric layer includes an oxide layer formed over said bonding silicon and a nitride layer formed over said oxide layer.

8. The apparatus of claim 1, wherein said second interlayer dielectric layer comprises a different etching selectivity relative to silicon.

9. The apparatus of claim 1, wherein said first impurity region comprises p+ type impurity and said second impurity region comprises n+ type impurity.

10. The apparatus of claim 1, wherein said second impurity region is formed over a lower side of said bonding silicon relative to the position of said first impurity region.

* * * * *